United States Patent
Chou et al.

(10) Patent No.: US 7,122,939 B2
(45) Date of Patent: Oct. 17, 2006

(54) PIEZOELECTRIC POWER SUPPLY

(75) Inventors: Chin-Wen Chou, Taipei Hsien (TW);
Eddie Cheng, Taipei Hsien (TW);
Kuang-Ming Wu, Taipei Hsien (TW);
Chin-Biau Chung, Taipei Hsien (TW)

(73) Assignee: Zippy Technology Corp., Hsin Tien (TW)

( * ) Notice: Subject to any disclaimer, the term of this patent is extended or adjusted under 35 U.S.C. 154(b) by 96 days.

(21) Appl. No.: 10/875,238

(22) Filed: Jun. 25, 2004

(65) Prior Publication Data

US 2005/0285476 A1    Dec. 29, 2005

(51) Int. Cl.
*H01L 41/07* (2006.01)
(52) U.S. Cl. ...................... 310/318; 310/359
(58) Field of Classification Search ........... 310/318, 310/359
See application file for complete search history.

(56) References Cited

U.S. PATENT DOCUMENTS

| | | | | |
|---|---|---|---|---|
| 3,707,636 | A * | 12/1972 | Inoue | 310/318 |
| 6,087,757 | A * | 7/2000 | Honbo et al. | 310/316.01 |
| 6,433,458 | B1 * | 8/2002 | Nakatsuka et al. | 310/316.01 |
| 6,724,126 | B1 * | 4/2004 | Chou | 310/318 |
| 6,791,239 | B1 * | 9/2004 | Chou et al. | 310/318 |
| 6,914,365 | B1 * | 7/2005 | Chou et al. | 310/318 |
| 6,943,785 | B1 * | 9/2005 | Chou et al. | 345/204 |
| 6,949,867 | B1 * | 9/2005 | Chou | 310/318 |
| 2004/0095341 | A1 * | 5/2004 | Chou et al. | 345/211 |
| 2005/0029905 | A1 * | 2/2005 | Dal et al. | 310/317 |

FOREIGN PATENT DOCUMENTS

| | | |
|---|---|---|
| TW | 492204 | 6/2002 |
| TW | 504101 | 9/2002 |

* cited by examiner

*Primary Examiner*—Darren Schuberg
*Assistant Examiner*—Derek Rosenau
(74) *Attorney, Agent, or Firm*—Birch, Stewart, Kolasch & Birch, LLP

(57) ABSTRACT

A piezoelectric power supply has a piezoelectric transformer circuit configuration which is alterable flexibly according to varying loading power requirements. It includes a control unit (control IC), a power switch (MOSFET) and an inductor to drive a piezoelectric transformer unit to actuate a high voltage and power load such as a cold cathode fluorescent lamp. The piezoelectric transformer unit consists of a plurality of piezoelectric transformers coupled in parallel. The specification of the piezoelectric transformers (single sheet piezoelectric transformers or low level laminated piezoelectric transformers) and parallel coupling number may be altered according to the required power of the load to change the voltage and current output by the piezoelectric transformers.

12 Claims, 8 Drawing Sheets

PIEZOELECTRIC POWER SUPPLY

FIELD OF THE INVENTION

The present invention relates to a piezoelectric power supply and particularly to a piezoelectric power supply that has a novel piezoelectric transformer circuit configuration which is alterable flexibly according to varying loading power.

BACKGROUND OF THE INVENTION

Ceramic piezoelectric transformer was first introduced by C. A. Rosen in 1956. Its operation principle is different from the magnetic transformer that transforms electromagnetic energy. The piezoelectric transformer first transforms electromotive force to mechanical energy (this process is called inverse piezoelectric effec), then transforms the mechanical energy to electric energy (this process is called positive piezoelectric effect). The ceramic transformer is a new type of electronic transformer made by sintering ferroelectric ceramic material and polarized under high pressure. Its basic operation frequency ranges from dozens KHz to hundreds KHz in the supersonic frequency zone.

The piezoelectric transformer makes fabricating high efficiency and small size converters possible. Compared with the piezoelectric transformer, the magnetic transformer of the same given power is thicker, heavier and has a lower efficiency. But its cost is lower, and can operate in a wide range of loading conditions. Hence for a long time the cold cathode fluorescent lamp (CCFL) that requires high actuating and ignition voltage is supported by the winding magnetic transformer with a high coil ratio. However, development of the piezoelectric transformer has great progresses in recent years. Now it can offer advantages such as higher efficiency, smaller size, lower electromagnetic noise, higher ignition voltage, non-flammable, and sinusoid operation, etc. For instance, R.O.C. patent publication No. 504101 discloses a "High luminosity fluorescent lamp driving apparatus" which employs the piezoelectric transformer.

The piezoelectric transformer includes a rectangular piezoelectric ceramic layer to perform energy transformation, a pair of primary electrodes (for input) and a pair of secondary electrodes (for output). Electric signals input to the primary electrodes are converted to mechanical vibrations through a piezoelectric fashion. The mechanical vibrations are transferred to the secondary ceramic layer to be converted to a high electric potential through the piezoelectric fashion to be output. The voltage gain of the piezoelectric transformer is the function of piezoelectric material coefficient g( ), primary layer number, material thickness and the entire length, as indicated in the equation below:

$$V \text{ (Voltage gain)} = (\text{Length} \times \text{Layer No.}/\text{Thickness})g(\ )$$

In terms of the hardware structure, the piezoelectric transformer has single sheet (or single layer) structure and laminated structure. The single sheet piezoelectric transformer may be fabricated easier at a lower cost, but has a lower voltage gain (typically 5–10), and might require a voltage boosting magnetic transformer to actuate a lamp set. On the other hand, the laminated piezoelectric transformer has a higher voltage gain (20–70) and can actuate a load of a greater power. For instance, R.O.C. patent publication No. 492204 entitled "High output laminated piezoelectric transformer" is such an example. But the design and fabrication of the laminated piezoelectric transformer is more difficult, and the production yield is lower. At present only a few well known manufacturers have the fabrication techniques for such products. Moreover, the laminated piezoelectric transformer to actuate CCFL requires different output powers depending on varying CCFL specifications of various vendors. The manufacturers have to customize the laminated piezoelectric transformer to meet customer's requirements. Hence fabrication cost is higher, and the specification is not very flexible.

SUMMARY OF THE INVENTION

The primary object of the present invention is to provide a piezoelectric power supply that offers a composite specification of the piezoelectric transformer that is alterable flexibly according to the loading power.

To achieve the foregoing object, the piezoelectric power supply according to the invention adopts a composite specification for the piezoelectric transformer. In one embodiment of the invention, a plurality of single sheet piezoelectric transformers or lower level laminated piezoelectric transformers with a few layers are coupled in parallel to provide a higher output power to meet the requirement of a higher power load.

Another object of the invention is to provide a piezoelectric power supply with a greater power output and flexible production and assembly to provide electric current required in selected loads such as CCFLs.

The piezoelectric power supply according to the invention employs the single sheet piezoelectric transformer as the basic construction element. By adopting parallel coupling, the secondary electrode of each parallel piezoelectric transformer is connected to the same load to provide a greater output power. Thus the multi-layer laminated piezoelectric transformer that is expensive and has a lower production yield is not required.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

The embodiments of the invention illustrated below use CCFLs as the loads for detailed discussions.

Figure 1:
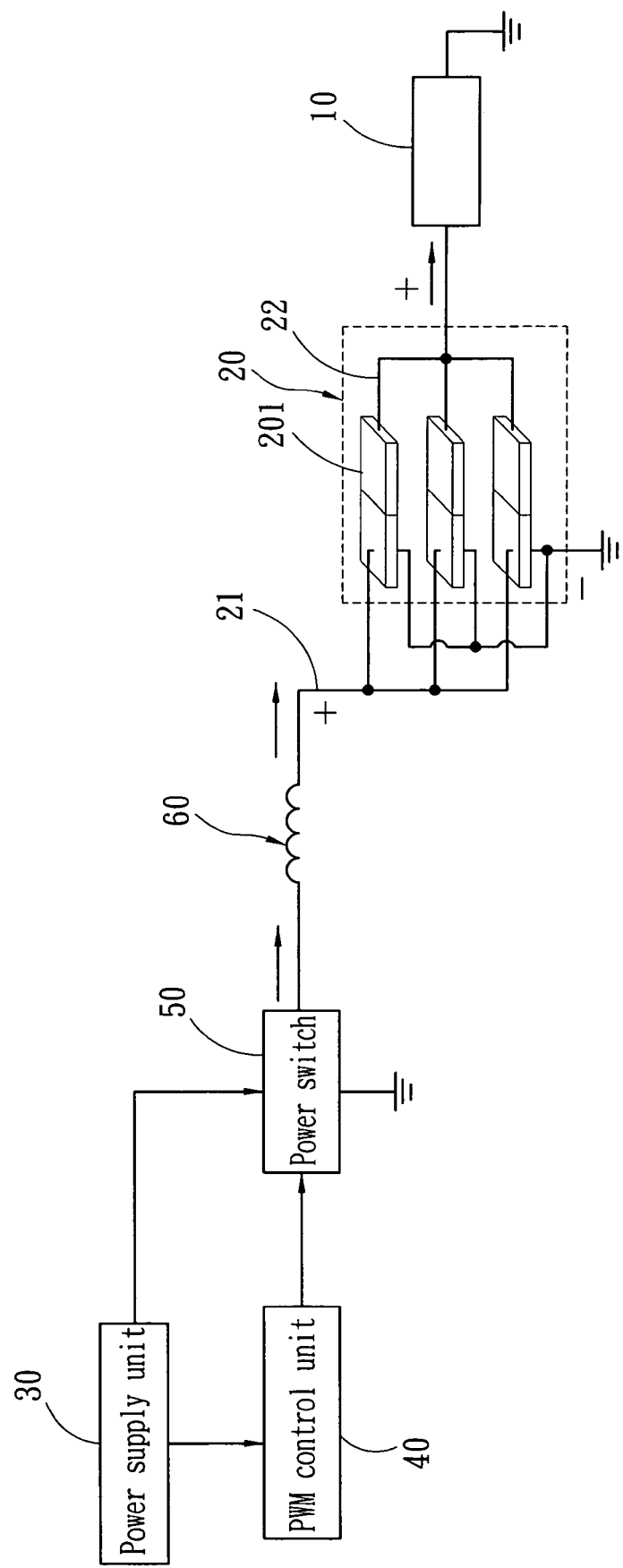
FIG. 1 is a basic circuit topologic diagram of a first embodiment of the invention.

Refer to FIG. 1 for the basic circuit topologic diagram of the piezoelectric power supply of the invention to ignite a CCFL 10. It is an AC power supply that is also a pulse-width modulation (PWM) power supply (but not as a limitation). The technique of the PWM power supply is known in the art, details will be omitted. It includes:

a piezoelectric transformer unit 20 which consists of single sheet piezoelectric transformers 201 that have respectively a primary electrode 21 on a first side and a secondary electrode 22 on a second side to transform a high frequency AC signal input from the primary electrode 21 to a high voltage to be output on the secondary electrode 22 to ignite the CCFL 10 connecting to the secondary electrode 22;

a power supply unit 30 to provide an electric power source required to actuate the CCFL 10 (depending on the specification of the CCFL 10, generally is a DC power with the voltage from 0 to several volts);

a PWM control unit 40 to output a PWM signal through a pulse-width modulation technique;

a power switch 50 driven by the PWM signal and turned ON and OFF alternately in the positive half cycle and the negative half cycle through the PWM signal to output a modulated DC operation current. Namely, the PWM signal alters the void ratio of the DC current output from the power supply unit 30 at 0 volt and the full amplitude output (3.3 V); and an inductor 60 which is an energy conversion element having one end connecting to an output end of the power switch 50 and another end connecting to the primary electrode 21 of the piezoelectric transformer unit 20 to transform the DC operation current from the power switch 50 to a high frequency AC signal, then input to the primary electrode 21 of the piezoelectric transformer unit 20.

Figure 2:
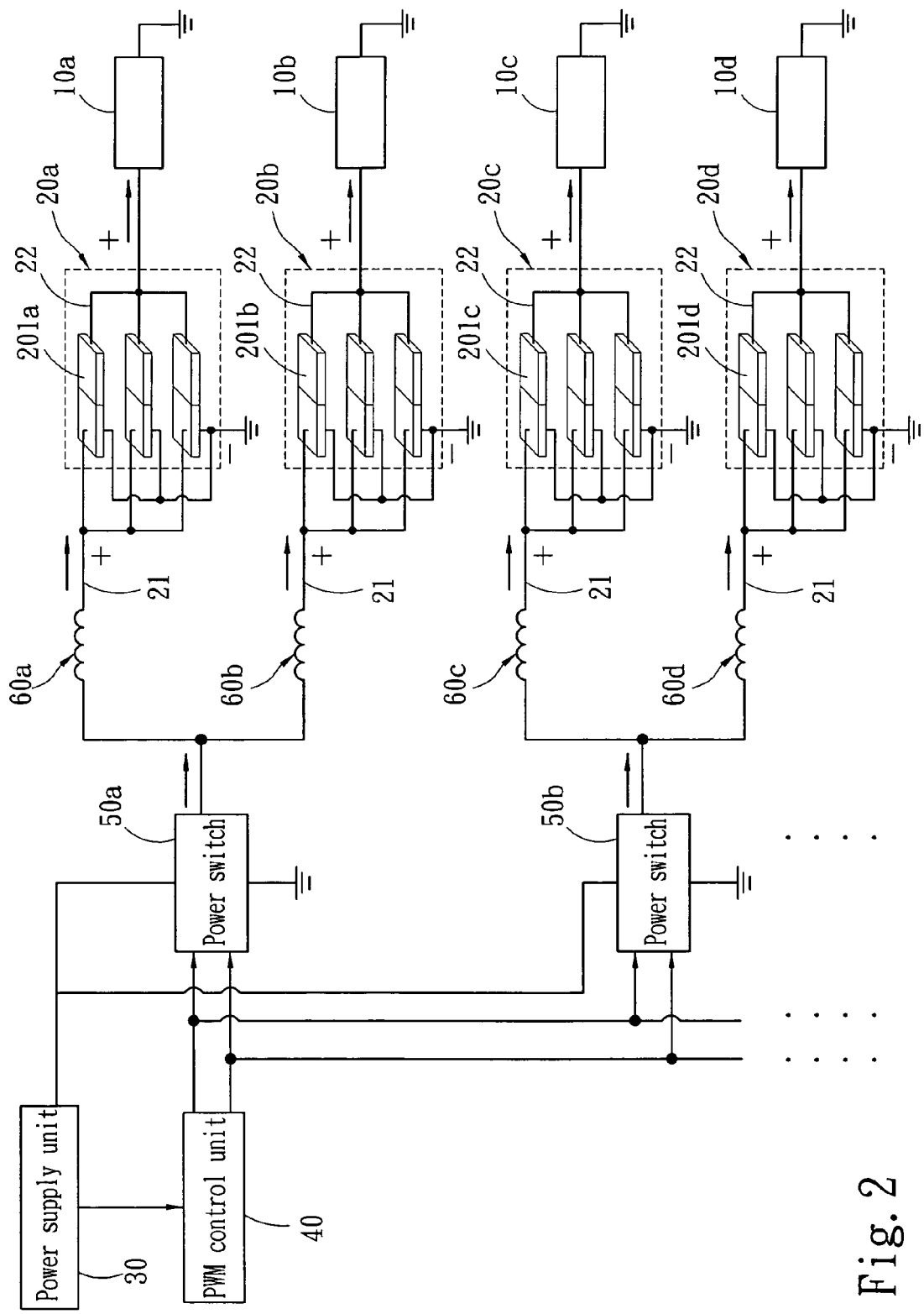
FIG. 2 is a circuit topologic diagram of a first embodiment of the invention.

Refer to FIG. 2 for a first embodiment of the circuit of the invention that aims to ignite a CCFL 10a of a greater power that cannot be actuated by one single sheet piezoelectric transformer. The piezoelectric transformer unit 20a consists of a plurality of single sheet piezoelectric transformers 201a. The primary electrodes 21 of the single sheet piezoelectric transformers 201a are jointly connected to the one end of the inductor 60a, and the secondary electrodes 22 of the single sheet piezoelectric transformers 201a are jointly connected to the input end (high voltage end) of the CCFL 10a to actuate and ignite the CCFL 10a in a cooperative manner. Of course, to drive the multiple single sheet piezoelectric transformers 201a, the inductor 60a and the power switch 50a must have a matching power.

Likewise, transformer units 20b, 20c and 20d each consist of a plurality of single sheet piezoelectric transformers 201b, 201c and 201d, respectively. The primary electrodes are connected to one end of corresponding inductors 60b, 60c and 60d.

As the CCFL 10 have many different specifications, such as long tube or short tube; and the actuating circuit also has many types, such as the long tube is ignited by a push-pull circuit, and the number of loads driven by each element also is different, hence the circuit configuration could vary. But the basic structure shown in FIG. 1 still is applied. The piezoelectric transformer of the invention is adaptable to these variations. More embodiments are discussed below.

Figure 5:
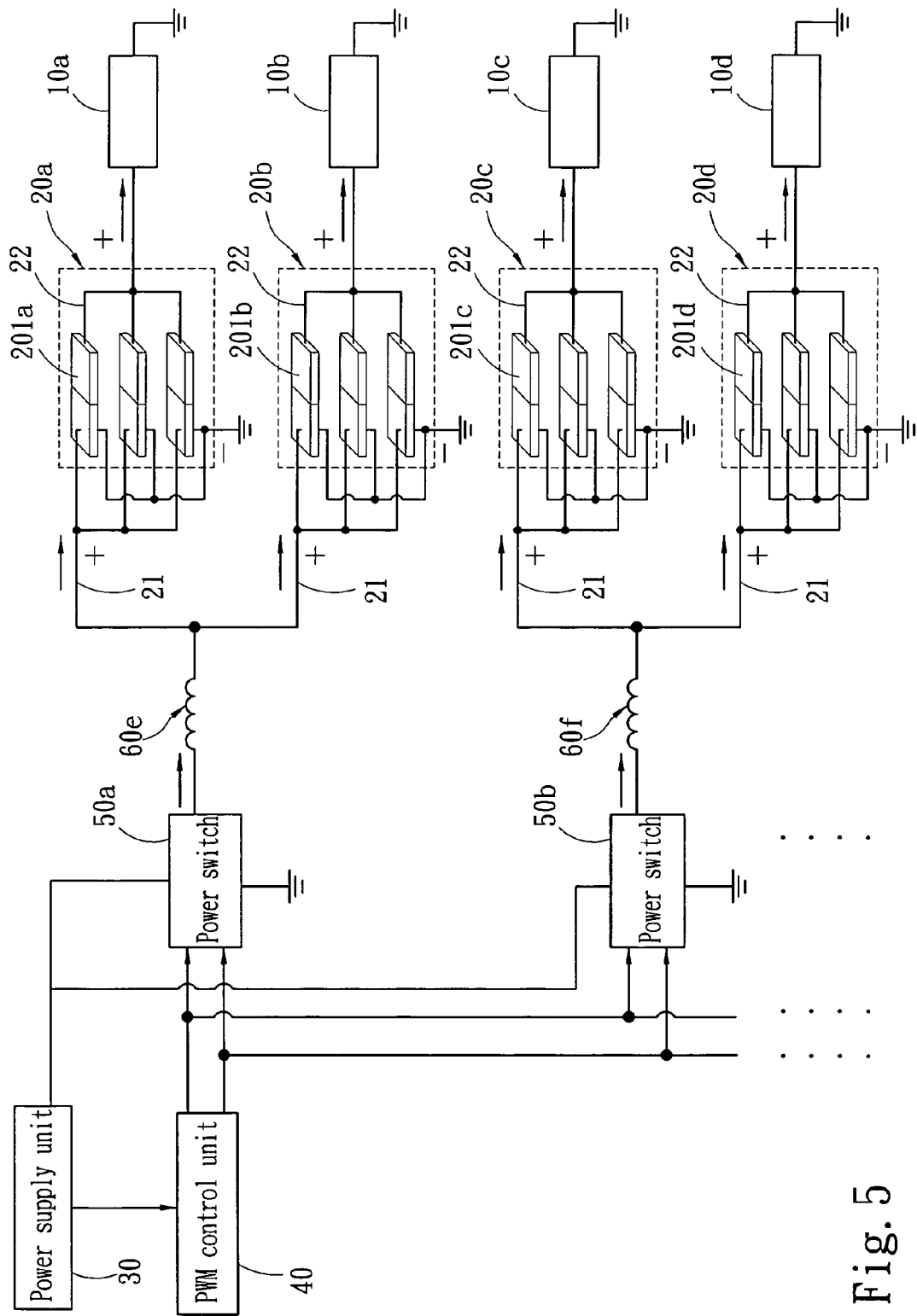
FIG. 5 is a circuit topologic diagram of a fourth embodiment of the invention

Refer to FIGS. 2 through 7 for the circuit topologic diagrams of various embodiments that employ a single power supply unit 30 and a single PWM control unit 40 to control a plurality of loads (namely CCFLs 10a–10d . . . ). The circuit of the power switch, inductor and piezoelectric transformer unit may have different designs as follow:

FIG. 2 shows CCFLs 10a–10d are driven respectively by a matching piezoelectric transformer unit 20a–20d and inductor 60a–60d. One power switch 50a or 50b respectively drives two or more inductors 60a and 60b, and 60c and 60d. FIG. 5 illustrates another circuit topologic structure which has one inductor 60e (or 60f) driving two parallel piezoelectric transformer units 20a and 20b, and 20c and 20d.

Figure 3:
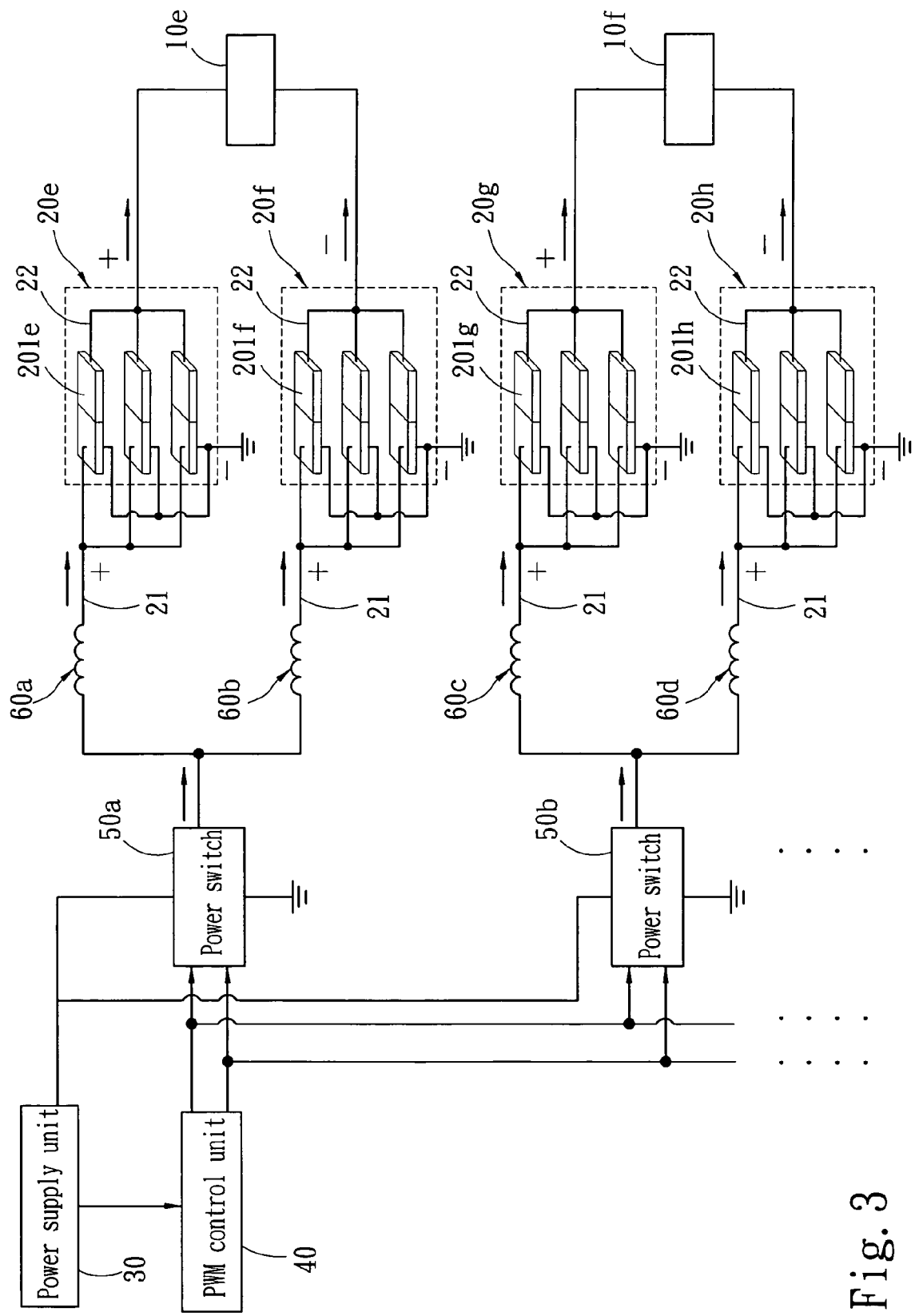
FIG. 3 is a circuit topologic diagram of a second embodiment of the invention for a push-pull circuit structure.

Refer to FIG. 3 for another embodiment in which CCFLs 10e–10f are driven by a push-pull circuit that is usually employed to ignite the lamp of a long tube. As shown in FIG. 3, the CCFL 10e is driven by matching piezoelectric transformer units 20e and 20f that are actuated respectively by inductors 60a and 60b. Similarly, another CCFL 10f is driven by matching piezoelectric transformer units 20g and 20h that are actuated respectively by inductors 60c and 60d.

Figure 6:
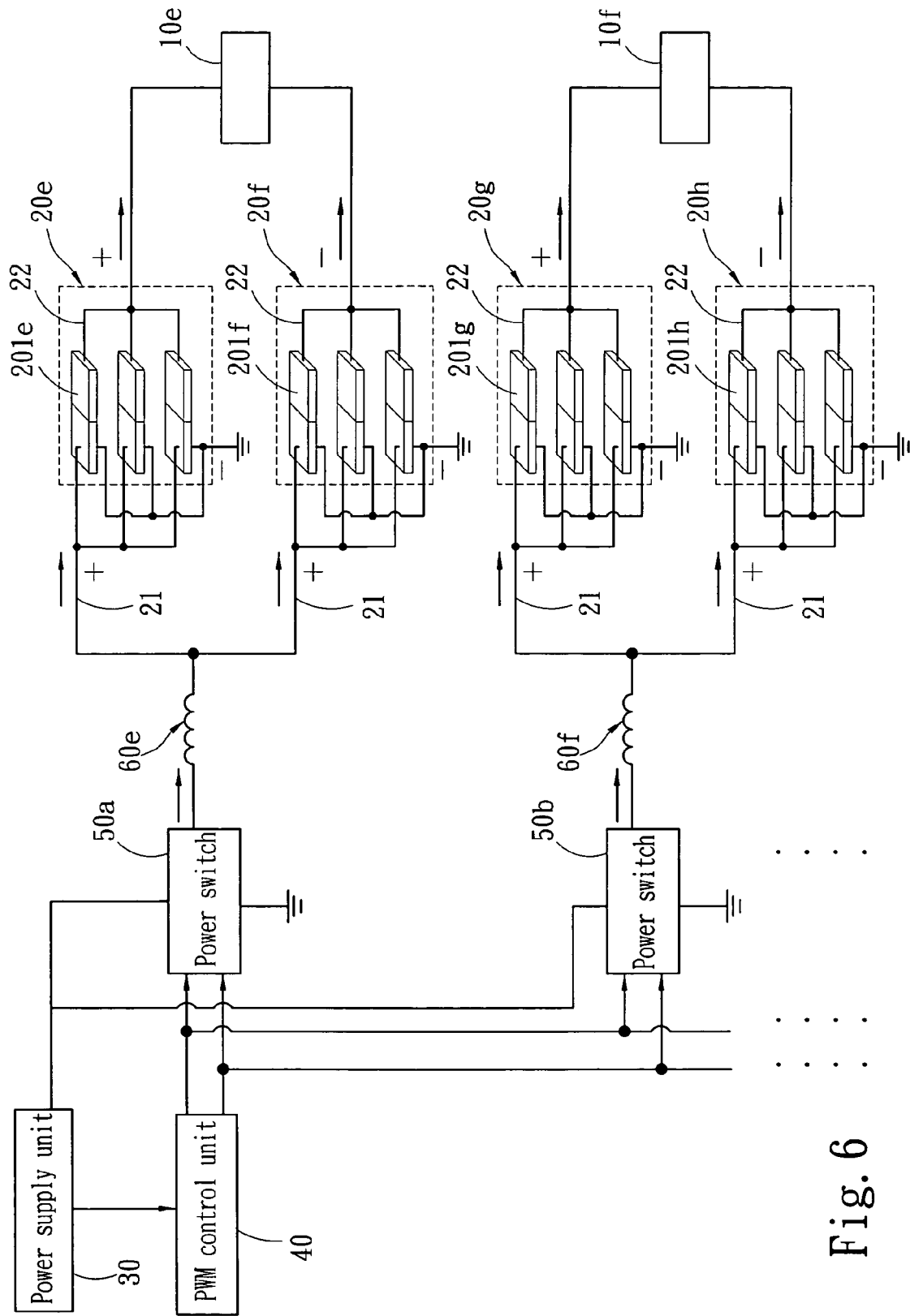
FIG. 6 is a circuit topologic diagram of a fifth embodiment of the invention for a push-pull circuit structure.

One power switch 50a or 50b drives two or more inductors 60a and 60b, and 60c and 60d. FIG. 6 also is a push-pull circuit that has one inductor 60e (or 60f) driving two parallel piezoelectric transformer units 20e and 20f and 20g and 20h. Each transformation unit 20e, 20f, 20g and 20h contains a plurality of single sheet piezoelectric transformers 201e, 201f, 201g and 201h, respectively.

Figure 4:
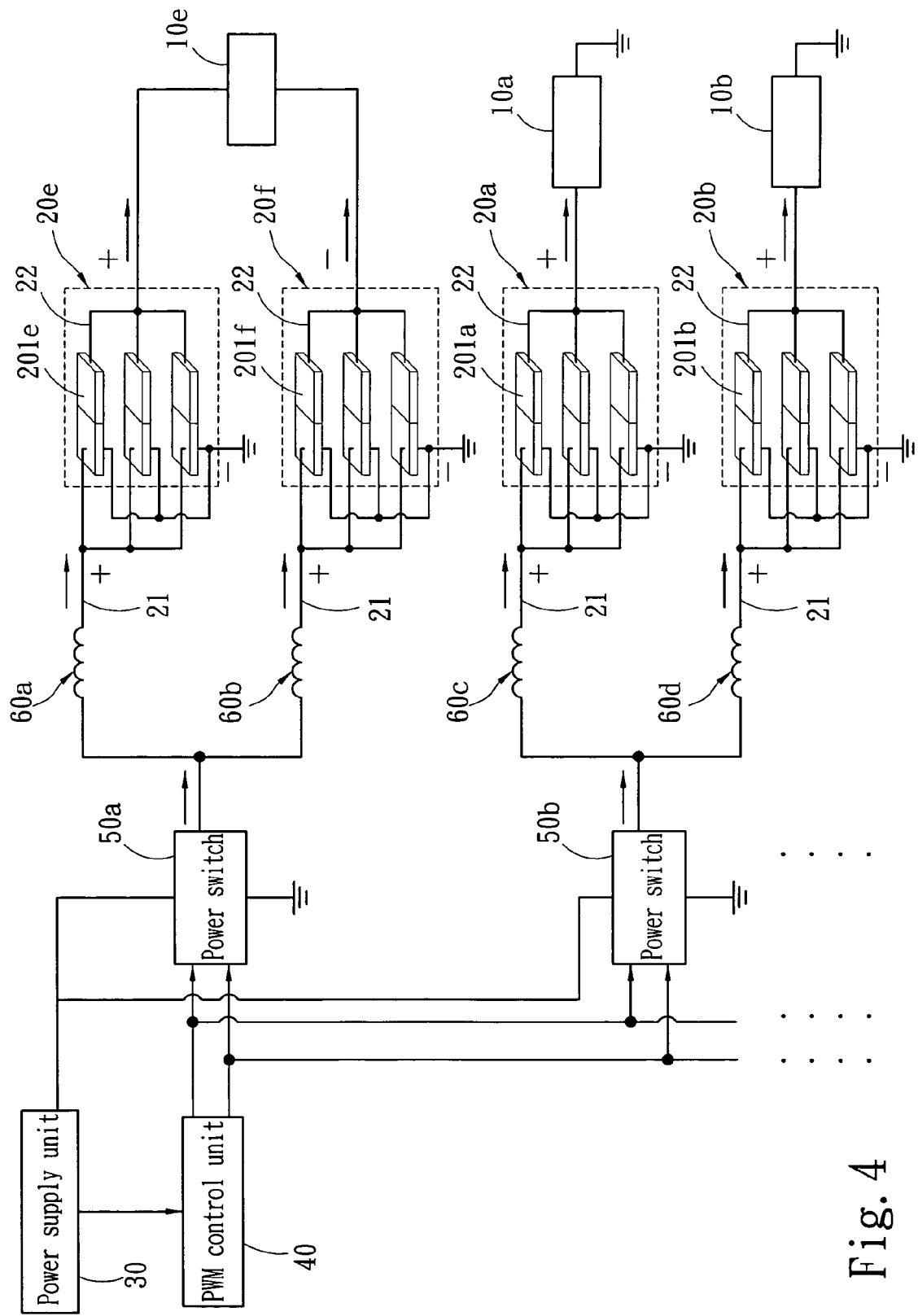
FIG. 4 is a circuit topologic diagram of a third embodiment of the invention showing a composite structure based on FIGS. 2 and 3.
Figure 7:
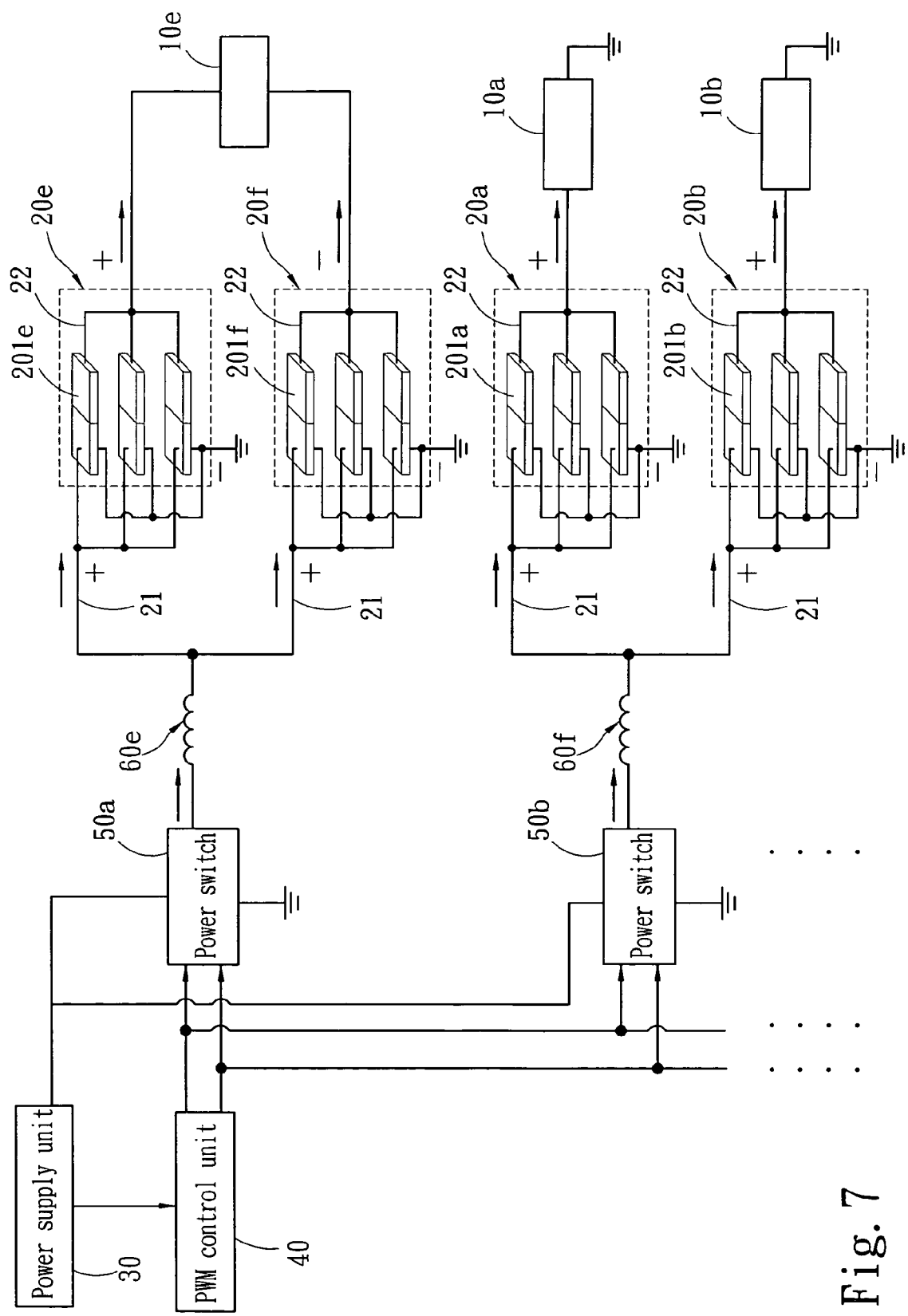
FIG. 7 is a circuit topologic diagram of a sixth embodiment of the invention showing a composite structure based on FIGS. 5 and 6.

FIG. 4 is a composite circuit topologic structure based on FIG. 2 and FIG. 3. Similarly, FIG. 7 is a composite circuit topologic structure based on FIG. 5 and FIG. 6. Details are omitted.

Figure 8:
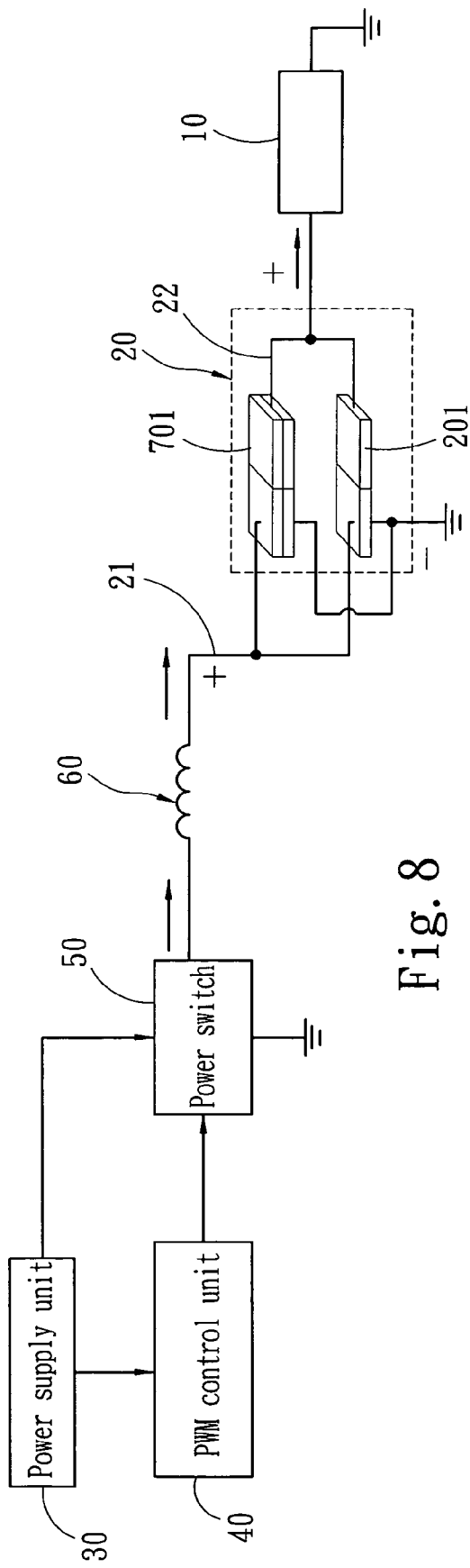
FIG. 8 is a basic circuit topologic diagram of a second embodiment of the invention.
Figure 9:
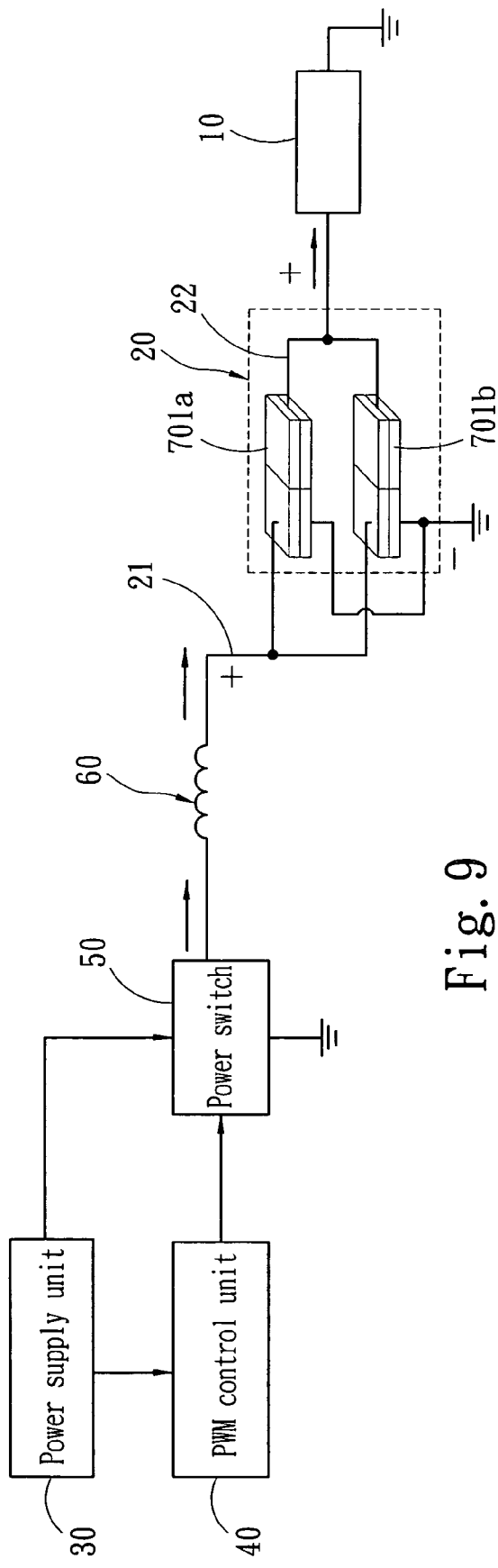
FIG. 9 is a basic circuit topologic diagram of a second embodiment of the invention.

While the embodiments set forth above employ the single sheet piezoelectric transformer 201 as the basic structural element of the piezoelectric transformer unit 20, in practice, a low level laminated piezoelectric transformer (such as four or two layers) may also be used. FIG. 8 illustrates an embodiment which includes a double-layer laminated piezoelectric transformer 701 and a single sheet piezoelectric transformer 201 coupled in parallel to form a piezoelectric transformer unit 20. While it provides a voltage same as the one consisting of three parallel single sheet piezoelectric transformers 201, it consists of fewer elements and may be assembled and installed easier. Similarly, two double-layer laminated piezoelectric transformers 701a and 701b may be coupled in parallel to form a piezoelectric transformer unit 20 (referring to FIG. 9). The lower level laminated piezoelectric transformer also has a primary electrode on a first side and a secondary electrode on a second side. The primary electrodes are coupled in parallel and connected to one end of an inductor, while the secondary electrodes also are coupled in parallel and connected to the input end of the load.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A piezoelectric power supply comprising a control unit, a power switch and an inductor to drive a piezoelectric transformer unit to actuate a load to operate, wherein:

the piezoelectric transformer unit includes a plurality of piezoelectric transformers which are selected and coupled in parallel to the load according to the required power of the load to alter the voltage and current output by the entire piezoelectric transformer unit;

said power switch includes a plurality of power switches connected in parallel with each power switch driving at least one piezoelectric transformer unit; and two piezoelectric transformer units are connected to a single load in a push-pull configuration.

2. The piezoelectric power supply of claim 1, wherein the piezoelectric transformers are single sheet piezoelectric transformers.

3. The piezoelectric power supply of claim 2, wherein the single sheet piezoelectric transformers have respectively a primary electrode on a first side and a secondary electrode on a second side, the primary electrodes being coupled in parallel and connected to one end of the inductor, the secondary electrodes being coupled in parallel and connected to an input end of the load.

4. The piezoelectric power supply of claim 1, wherein the piezoelectric transformers are a low level laminated piezoelectric transformer.

5. The piezoelectric power supply of claim 4, wherein the low level laminated piezoelectric transformers have respectively a primary electrode on a first side and a secondary electrode on a second side, the primary electrodes being coupled in parallel and connected to one end of the inductor, and the secondary electrodes being coupled in parallel and connected to an input end of the load.

6. The piezoelectric power supply of claim 1, wherein the piezoelectric transformer unit includes a single sheet piezoelectric transformer and a low level laminated piezoelectric transformer.

7. The piezoelectric power supply of claim 6, wherein the single sheet piezoelectric transformer and the low level laminated piezoelectric transformer have respectively a primary electrode on a first side and a secondary electrode on a second side, the primary electrodes being coupled in parallel and connected to one end of the inductor, the secondary electrodes being coupled in parallel and connected to an input end of the load.

8. The piezoelectric power supply of claim 1, wherein each piezoelectric transformer unit is connected to a separate load.

9. The piezoelectric power supply of claim 1, wherein each piezoelectric transformer unit has a separate inductor.

10. The piezoelectric power supply of claim 1, wherein each power switch has an inductor connected to more than one piezoelectric transformer.

11. A piezoelectric power supply comprising:

a control unit;

a plurality of power switches connected in parallel;

at least one inductor connected to each power switch;

at least two piezoelectric transformer units being connected to each power switch, each piezoelectric transformer unit having a plurality of piezoelectric transformers coupled in parallel;

a plurality of loads, with at least one load corresponding to each power switch;

wherein each load is connected to a pair of piezoelectric transformers in a push-pull configuration.

12. The piezoelectric power supply of claim 11, wherein each load is connected to a single piezoelectric transformer unit.

* * * * *